Jan. 19, 1954 L. E. BARTON 2,666,874

CONSTRUCTION OF SEMICONDUCTOR DEVICES

Filed Aug. 25, 1950

INVENTOR
LOY E. BARTON
BY H. D. Haworth
ATTORNEY

Patented Jan. 19, 1954 2,666,874

UNITED STATES PATENT OFFICE 2,666,874

CONSTRUCTION OF SEMICONDUCTOR DEVICES

Loy E. Barton, Princeton, N. J., assignor to Radio Corporation of America, a corporation of Delaware Application August 25, 1950, Serial No. 181,362

5 Claims. (Cl. 317—235)

This invention relates generally to semi-conductor devices, and particularly relates to the construction of a semi-conductor device suitable for use in amplifier, oscillator, modulator and the like circuits and to a method of preparing electrodes for such devices.

A semi-conductor device of the type referred to may comprise a semi-conducting body such as a crystal of silicon or germanium. A base electrode, an emitter electrode and a collector electrode are in contact with the crystal. The base electrode is in low-resistance contact with the crystal so that it controls the potential of the bulk of the crystal and may, for example, consist of a suitable piece of metal soldered to the crystal. Usually, although not necessarily, the base electrode is in large-area contact with the crystal. The emitter and collector electrodes are in rectifying contact with the crystal and may, for example, consist of pointed wires of tungsten or Phosphor bronze. Usually, emitter and collector are small-area electrodes which may be in point contact or in line contact with the crystal. A device of this type is usually called a transistor.

For operation as an amplifier the emitter is biased in the forward direction and the collector is biased in the reverse direction with respect to the base. Thus, if the semi-conducting crystal is of the N type, the emitter should be positive and the collector negative with respect to the base. If the crystal is of the P type, the potentials must be reversed.

In a transistor the charge carriers which may flow, for example, between emitter and collector have a finite transit time. Furthermore, there is a definite spread of the arrival time of charge carriers which have been injected at the same instance. This latter effect is due to the different paths of the charge carriers between, for example, emitter and collector. Recently, it has been suggested to confine the paths of the charge carriers which may be holes by means of a magnetic field as disclosed by C. B. Brown in Electronics, July 1950, pages 81 to 83. A copending application to L. E. Barton, Serial No. 106,926, filed on July 26, 1949, entitled "High Frequency Response Semi-Conductor Device" and assigned to the assignee of this application discloses another solution of the problem of the so-called transit time spread. In the Barton application, the thickness of the crystal is made very small. This, however, will not confine the paths of the charge carriers in all directions. The result of the spread of the charge carrier arrival time is that a higher input power is required and that the output falls off at higher frequencies. Furthermore, a phase shift exists between the input and output currents.

The spacing of the rectifying electrodes of a transistor also has an appreciable effect on its high-frequency performance. These electrodes are preferably generally spaced apart approximately two mils as is known. Since these electrodes usually consist of very fine wires, their ability to conduct heat is very small and accordingly the transistor during operation will be heated to an elevated temperature. This, in turn, impairs generally the performance of the semi-conductor device and limits the available output power.

It is accordingly an object of the present invention to provide an improved semi-conductor device suitable for use in amplifier, oscillator, modulator and the like circuits which has reduced input signal losses and a better high-frequency response in view of the reduction of the phase shift of the output currents with respect to the input currents.

A further object of the invention is to provide an improved transistor wherein the transit time of the charge carriers between the electrodes is reduced to a minimum as well as the spread of the arrival time of simultaneously injected charge carriers.

Another object of the invention is to provide a semi-conductor device of the type referred to having a better heat dissipation to provide for a larger power output and which requires but a minimum amount of semi-conducting material.

A still further object of the invention is to provide an improved construction for the rectifying electrodes of a semi-conducting device and a method of preparing such rectifying eletctrodes which will provide mechanically stable contacts, definitely spaced from each other by a predetermined, small distance and electrically insulated from each other.

A semi-conductor device in accordance with the present invention comprises a semi-conducting body which has a diameter not exceeding 10 mils in any direction. The semi-conducting body or crystal preferably is of roughly spherical shape and has a diameter of approximately 2 to approximately 10 mils. The device may have a conventional base electrode which may consist of a piece of soft metal in low-resistance contact with a portion of the body. The rectifying electrodes preferably are imbedded in a block of insulating material whereby they are definitely spaced and insulated from each other. The wires imbedded in the insulating block approach each other at a small angle and are exposed on a surface of the block where they have a small, predetermined distance from each other.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
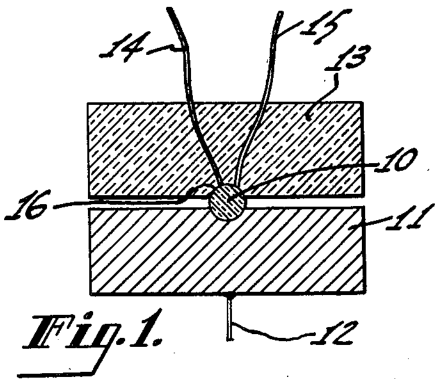
Figure 1 is a sectional view of a semi-conductor device embodying the present invention.

Referring now to the drawing, in which like components have been designed by the same reference numerals throughout the figures, and particularly to Figure 1, a semi-conductor device comprises a body 10 of semi-conducting material which may, for example, consist of germanium or silicon. As shown in Figure 1, body 10 is of substantially spherical shape. Its diameter should not exceed approximately 10 mils in any direction and preferably its diameter is between 2 and 10 mils.

A portion of the surface of body 10 is in low-resistance contact with block 11 which preferably consists of a soft metal such, for example, as tin. Tin block 11 may be simply pressed against body 10 until the body is partly immersed in block 11 as shown. Metallic block 11 may be provided with a lead or conductor 12 and represents the base electrode of the device which is in low-resistance contact with body 10. As shown in the drawing, a substantially hemispherical portion of body 10 contacts metallic block 11. Another block 13 is provided which consists of an insulating material, such, for example, as glass or a suitable plastic material. Two wires 14 and 15 which may, for example, have a diameter of 1 mil are imbedded in block 13 and approach each other until their mutual distance at surface 16 where they are exposed, is about one or two mils. It will be noted that surface 16 of block 13 is inwardly curved to receive body 10. Wires 14 and 15 may represent the emitter and collector electrodes which are in rectifying contact with body 10.

It will readily be seen that the different paths for the charge carriers such as holes injected, for example, by the emitter (which may be wire 14) until they are collected by the collector (which may be wire 15) are limited. Accordingly, the spread of the arrival time of the holes or charge carriers which are simultaneously injected is considerably reduced. Consequently, the device of Figure 1 has decreased input losses and an improved output at higher frequencies. Furthermore, the heat dissipation through blocks 11 and 13 is much improved resulting in a higher power output.

A semi-conducting body 10 of substantially spherical shape may be manufactured in the following manner. For example, molten germanium may be kept in a suitable crucible having a fine hole through which the liquid germanium is permitted to drop into a suitable bath containing, for example, water or oil. The small drops of germanium falling into the bath are solidified in substantially spherical shape. Alternatively, it is feasible to extrude a fine wire or filament of germanium. Such an elongated filament may be cut into suitable small pieces which may then be ground to substantially spherical shape in a manner well known for grinding ball bearings. Alternatively a small cylindrical piece obtained from the germanium filament may be used instead of a spherical body 10. It is to be understood that body 10 need not be of exact spherical shape because a soft metal such as tin may be pressed against the body to conform to its shape and to provide a low-resistance contact therewith.

Figure 2:
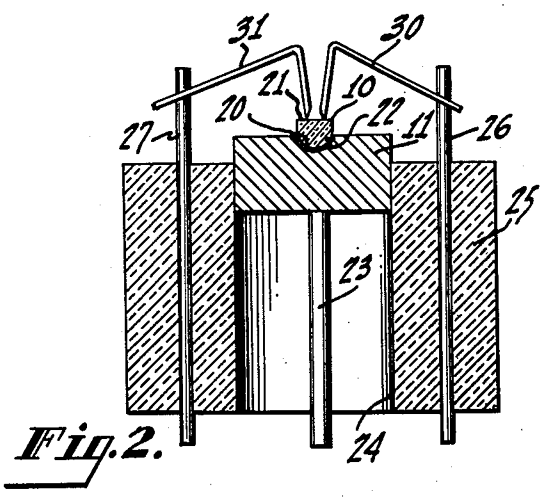
Figure 2 is a sectional view of a modified semi-conductor device in accordance with the invention.

A modification of the device of Figure 1 is illustrated in Figure 2. Semi-conducting body 10 again is very small and its diameter in any direction should be approximately 10 mils or less. It has a hemispherical surface 20 and a substantially flat surface 21. Its hemispherical surface 20 is soldered as shown at 22 to a metallic block 11 which may again consist of tin or any other suitable metal to provide a low-resistance contact with body 10. A heavy wire 23 is electrically connected to block 11 and provides an output terminal. Alternatively, body 10 may have a cylindrical shape.

Block 11 is disposed in a suitable aperture 24 in insulating support 25 through which supporting wires 26 and 27 extend. Two fine wires 30 and 31 have one end of each secured to supporting wires 26 and 27 respectively in any suitable manner such as by soldering or welding. The free ends of wires 30 and 31 are preferably pointed and are in rectifying contact with the flat surface 21 of body 10.

The device of Figure 2 operates substantially in the same manner as the device of Figure 1. The main difference is that wires 30 and 31 which represent the emitter and collector electrodes are not imbedded in an insulating material. However, semi-conducting body 10 is again so small as to limit the transit time spread in the manner previously explained.

Figure 3:
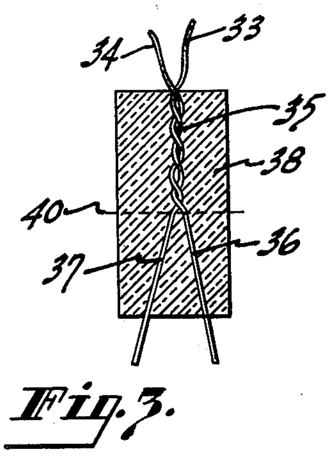
Figure 3 is a sectional view illustrating the method of insulating a pair of rectifying electrodes from each other and spacing them a definite, small predetermined distance from each other in accordance with the invention.

A preferred method in accordance with the present invention for insulating and spacing a pair of wires from each other for use as the rectifying electrodes of a semi-conducting device is illustrated in Figure 3. A pair of fine metallic wires 33 and 34 is provided. The wires may have a diameter of about one mil and may consist, for example, of phosphor bronze or tungsten. The wires are twisted about each other as indicated at 35. Contiguous portions 36 and 37 of the wires extend away from each other at a small angle from the last twist of the wires. Thereafter the twisted wire portion 35 and the contiguous portions 36 and 37 are imbedded in a suitable insulating material such as glass or a plastic material indicated at 38.

Now, the insulating material 38 and the twisted wire portion 35 are removed simultaneously in any suitable manner. This may, for example, be effected by grinding off the wires and the insulating material down to dotted line 40. The grinding or removal of material is continued until the distance between the exposed ends of the wires equals the desired distance which may, for example, be one mil. In this manner the distance between the exposed ends of the wires may be made any desired, small value.

The wires are then electrically insulated from each other and their distance remains constant. The insulating block 38 provides for a better heat dissipation. It is also feasible to provide a pair of flat ribbons instead of a pair of wires. The ribbons may have a thickness of one-half mil and a width of from 5 to 10 mils. It will be understood that the exposed ends of wires 36 and 37 will be slightly raised above the surface of insulating material 35 so that the wires may make contact with a semi-conducting material.

Figure 4:
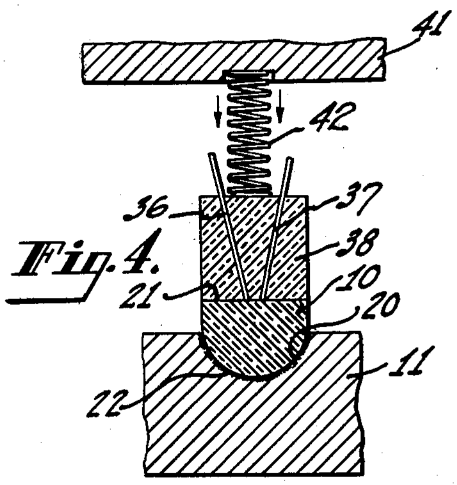
Figure 4 is an enlarged sectional view of a modification of the semi-conductor device of Figure 2 in accordance with the present invention.

Figure 4 illustrates a semi-conductor device utilizing the rectifying electrodes of Figure 3. Thus, body 10 is again provided with a hemispherical surface 20 and with a flat surface 21 or else body 10 may be of cylindrical shape. Its hemispherical surface 20 is soldered at 22 to metallic block 11. Wires 36 and 37 imbedded in insulating block 38 are pressed against the flat surface 21 of body 10. This may, for example, be effected by a spring 42 pressing against the top of insulating block 38 and held by a suitable support 41.

The device of Figure 4 provides for a better conduction of heat, and wires 36, 37 are electrically insulated from each other and definitely and permanently spaced from each other. The contacts are mechanically stable and very close spacing is possible. The device as illustrated in Figures 1, 2 and 4 requires but a minimum amount of semi-conducting material, such as germanium.

What is claimed is:

1. A semi-conductor device comprising a semi-conducting body of substantially spherical shape and having a diameter which does not exceed approximately 10 mils in any direction, a member of soft metal in a low-resistance contact with a substantial portion of the surface of said body, a block of insulating material, a pair of wires imbedded in said block, said block having a curved surface along which the ends of said wires are exposed in spaced apart relationship, said curved surface of said block conforming to and contacting another surface portion of said body whereby said wires are caused to make rectifying contact with said body when said surfaces are in contact.

2. A semi-conductor device comprising a semi-conducting body of substantially spherical shape and having a diameter which does not exceed approximately 10 mils in any direction, a member of tin in low-resistance contact with a substantially hemispherical portion of the surface of said body, a block of insulating material, a pair of fine metallic wires imbedded in said block, said block having a curved surface along which said wires are exposed in spaced apart relationship, said curved surface of said block being of such a shape as to contact another surface portion of said body with said wires in rectifying contact with said body.

3. The method of insulating a pair of elongated conductors which are spaced from each other a small predetermined distance, said method comprising twisting a portion of said conductors about each other, forming contiguous portions of said conductors to diverge away from each other at a small angle from the last one of the twists, imbedding the twisted portions of said conductors and at least a part of said contiguous portions in a body of insulating material, and removing said material and said twisted conductor portions in a plane intersecting said conductors intermediate the ends thereof to expose the ends of the conductors in a new surface of said body until the distance between said conductors at their exposed ends equals a predetermined small value.

4. The method of insulating a pair of wires which are spaced from each other a small predetermined distance, said method comprising twisting a portion of said wires about each other, shaping contiguous portions of said wires to diverge away from each other at a small angle from the last one of the twists, imbedding the twisted portions of said wires and said contiguous portions in a block of insulating material, and removing simultaneously said material and said twisted wire portions in a plane intersecting said wires intermediate the ends thereof until the distance between said wires at a new surface of the block and between their exposed free ends equals a predetermined small value.

5. A semi-conducting body of substantially spherical shape, a metallic member in low resistance contact with a substantial portion of the surface of said body, a block of insulating material, a pair of wires imbedded in said block, said block having a curved surface at which the ends of said wires are exposed in spaced apart relationship, said curved surface of said block conforming to and contacting a surface portion of said body whereby said wires are caused to make rectifying contact with said body when said surfaces are in contact.

LOY E. BARTON.

References Cited in the file of this patent

UNITED STATES PATENTS

| Number | Name | Date |
|---|---|---|
| 756,676 | Midgley | Apr. 5, 1904 |
| 924,827 | Pickard | June 15, 1909 |
| 1,211,754 | Rawls | Jan. 9, 1917 |
| 1,908,800 | Utne | May 16, 1933 |
| 2,156,660 | Van Geel | May 2, 1939 |
| 2,459,787 | Bloom | Jan. 25, 1949 |
| 2,486,776 | Barney | Nov. 1, 1949 |
| 2,538,593 | Rose | Jan. 16, 1951 |
| 2,549,550 | Wallace | Apr. 17, 1951 |
| 2,572,993 | Douglas et al. | Oct. 30, 1951 |
| 2,584,461 | James et al. | Feb. 5, 1952 |
| 2,597,734 | James et al. | May 20, 1952 |
| 2,606,960 | Little | Aug. 12, 1952 |
| 2,612,567 | Stuetzer | Sept. 30, 1952 |
| 2,627,545 | Muss et al. | Feb. 3, 1953 |